United States Patent
Tsai et al.

(10) Patent No.: US 11,855,208 B2
(45) Date of Patent: Dec. 26, 2023

(54) METHOD FOR FORMING FIN FIELD EFFECT TRANSISTOR (FINFET) DEVICE STRUCTURE

(71) Applicant: TAIWAN SEMICONDUCTOR MANUFACTURING CO., LTD., Hsinchu (TW)

(72) Inventors: Chun-Hsiung Tsai, Xinpu Township, Hsinchu County (TW); Shahaji B. More, Hsinchu (TW); Cheng-Yi Peng, Taipei (TW); Yu-Ming Lin, Hsinchu (TW); Kuo-Feng Yu, Zhudong Township, Hsinchu County (TW); Ziwei Fang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 246 days.

(21) Appl. No.: 16/898,659

(22) Filed: Jun. 11, 2020

(65) Prior Publication Data
US 2020/0303549 A1 Sep. 24, 2020

Related U.S. Application Data

(62) Division of application No. 15/893,081, filed on Feb. 9, 2018, now Pat. No. 10,686,074.
(Continued)

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02532* (2013.01); *H01L 21/26513* (2013.01);
(Continued)

(58) Field of Classification Search
CPC .......... H01L 29/7848; H01L 21/02532; H01L 21/26513; H01L 21/3065;
(Continued)

(56) References Cited

U.S. PATENT DOCUMENTS 6,399,450 B1 6/2002 Yu
8,772,109 B2 7/2014 Colinge
(Continued)

OTHER PUBLICATIONS

Everaert et al., "Sub-10-9 Ω.cm2 Contact Resistivity on p-SiGe Achieved by Ga Doping and Nanosecond Laser Activation", Pub. in 2017. Total 2 pages.
(Continued)

*Primary Examiner* — Benjamin Tzu-Hung Liu
(74) *Attorney, Agent, or Firm* — Birch, Stewart, Kolasch & Birch, LLP

(57) ABSTRACT

A method for forming a FinFET device structure is provided. The method includes forming a fin structure extended above a substrate and forming a gate structure formed over a portion of the fin structure. The method also includes forming a source/drain (S/D) structure over the fin structure, and the S/D structure is adjacent to the gate structure. The method further includes doping an outer portion of the S/D structure to form a doped region, and the doped region includes gallium (Ga). The method includes forming a metal silicide layer over the doped region; and forming an S/D contact structure over the metal silicide layer.

20 Claims, 16 Drawing Sheets

Related U.S. Application Data

(60) Provisional application No. 62/564,575, filed on Sep. 28, 2017.

(51) Int. Cl.

| | | |
|---|---|---|
| *H01L 21/265* | (2006.01) | |
| *H01L 21/3065* | (2006.01) | |
| *H01L 21/8234* | (2006.01) | |
| *H01L 27/088* | (2006.01) | |
| *H01L 29/06* | (2006.01) | |
| *H01L 29/08* | (2006.01) | |
| *H01L 29/167* | (2006.01) | |
| *H01L 29/45* | (2006.01) | |
| *H01L 29/66* | (2006.01) | |
| *H01L 21/027* | (2006.01) | |
| *H01L 29/161* | (2006.01) | |
| *H01L 29/36* | (2006.01) | |
| *H01L 29/165* | (2006.01) | |
| *H01L 21/3105* | (2006.01) | |

(52) U.S. Cl.
CPC .. *H01L 21/3065* (2013.01); *H01L 21/823418* (2013.01); *H01L 21/823431* (2013.01); *H01L 21/823437* (2013.01); *H01L 27/0886* (2013.01); *H01L 29/0649* (2013.01); *H01L 29/0847* (2013.01); *H01L 29/165* (2013.01); *H01L 29/167* (2013.01); *H01L 29/45* (2013.01); *H01L 29/665* (2013.01); *H01L 29/6656* (2013.01); *H01L 29/66545* (2013.01); *H01L 29/66636* (2013.01); *H01L 29/66795* (2013.01); *H01L 29/785* (2013.01); *H01L 29/7851* (2013.01); *H01L 21/0274* (2013.01); *H01L 21/31053* (2013.01); *H01L 29/161* (2013.01); *H01L 29/36* (2013.01)

(58) Field of Classification Search
CPC ..... H01L 21/823418; H01L 21/823431; H01L 21/823437; H01L 27/0886; H01L 29/0649; H01L 29/0847; H01L 29/165; H01L 29/167; H01L 29/45; H01L 29/665; H01L 29/66545; H01L 29/6656; H01L 29/66636; H01L 29/66795; H01L 29/785; H01L 29/7851; H01L 21/0274; H01L 21/31053; H01L 29/161; H01L 29/36
See application file for complete search history.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,425,317 B1 | 8/2016 | Wen et al. |
| 9,520,482 B1 | 12/2016 | Chang et al. |
| 9,543,438 B2 | 1/2017 | Tsai et al. |
| 9,576,814 B2 | 2/2017 | Wu et al. |
| 2012/0280250 A1* | 11/2012 | Basker ............ H01L 21/823821 438/230 |
| 2014/0061734 A1 | 3/2014 | Basker et al. |
| 2016/0111542 A1* | 4/2016 | Zhang ............... H01L 29/66795 438/283 |
| 2016/0336319 A1 | 11/2016 | Yang et al. |
| 2016/0822359 | 11/2016 | Glass et al. |
| 2017/0092765 A1 | 3/2017 | Doris et al. |
| 2017/0213889 A1 | 7/2017 | Gluschenkov et al. |
| 2018/0197793 A1 | 7/2018 | Guo et al. |
| 2018/0274097 A1 | 9/2018 | Lei et al. |
| 2018/0277541 A1* | 9/2018 | Gluschenkov ...... H01L 27/0924 |

OTHER PUBLICATIONS

Ioannou et al., "Gallium Implantation and Diffusion in Crystalline Germanium" pub. on Jan. 2010, Electrochemical and Solid-State Letters, 13 (3) H70-H72.
Page 72 in "Subsecond Annealing of Advanced Materials: Annealing by Lasers, Flash Lamps" by Wolfgang Skorupa and Heidemarie Schmidt https://books.google.com.tw/books?id=y_e7BAAAQBAJ&pg=PA72&lpg=PA72&dq=sims.

* cited by examiner

METHOD FOR FORMING FIN FIELD EFFECT TRANSISTOR (FINFET) DEVICE STRUCTURE

CROSS REFERENCE TO RELATED APPLICATIONS

This application is a divisional application of U.S. application Ser. No. 15/893,081, filed Feb. 9, 2018, which claims the benefit of U.S. Provisional Application No. 62/564,575 filed on Sep. 28, 2017, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2E' shows a cross-sectional representation of a FinFET device structure, in accordance with some embodiments of the disclosure.

FIG. 3E' shows a cross-sectional representation of the FinFET device structure, in accordance with some embodiments of the disclosure.

FIG. 4D' shows a cross-sectional representation of a FinFET device structure, in accordance with some embodiments of the disclosure.

FIG. 5D' shows a cross-sectional representation of a FinFET device structure, in accordance with some embodiments of the disclosure.

DETAILED DESCRIPTION

Figure 1A:
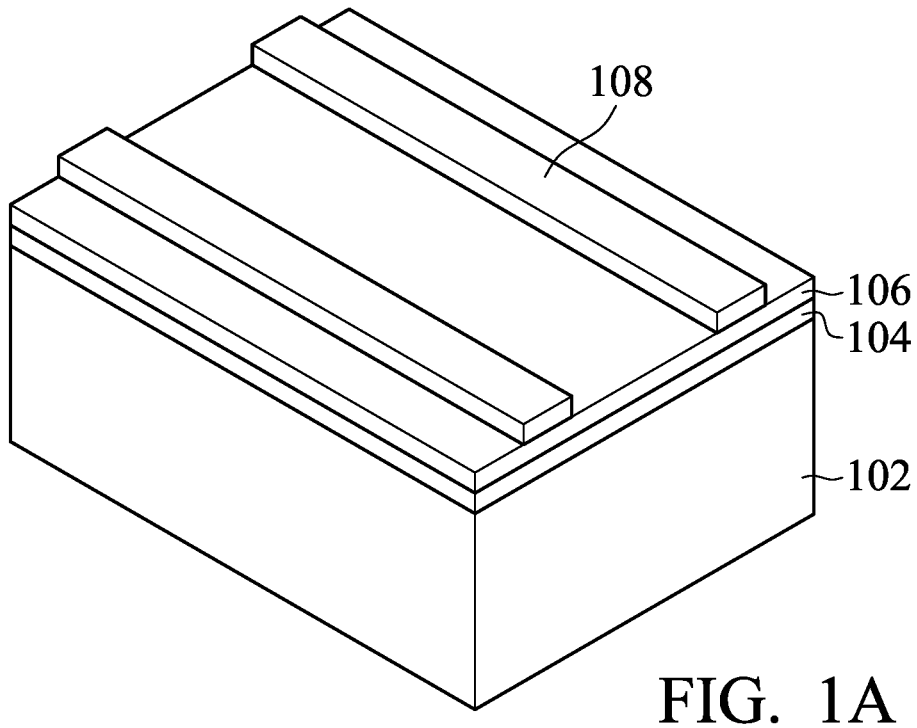
FIGS. 1A-1J show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1J show perspective representations of various stages of forming a FinFET device structure 100, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
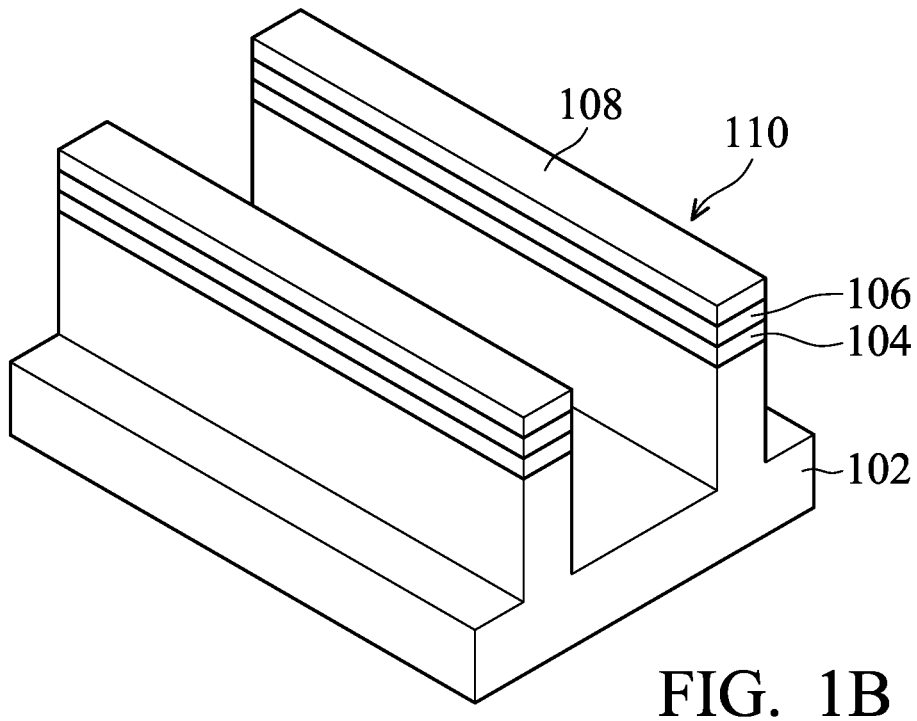

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned pad layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
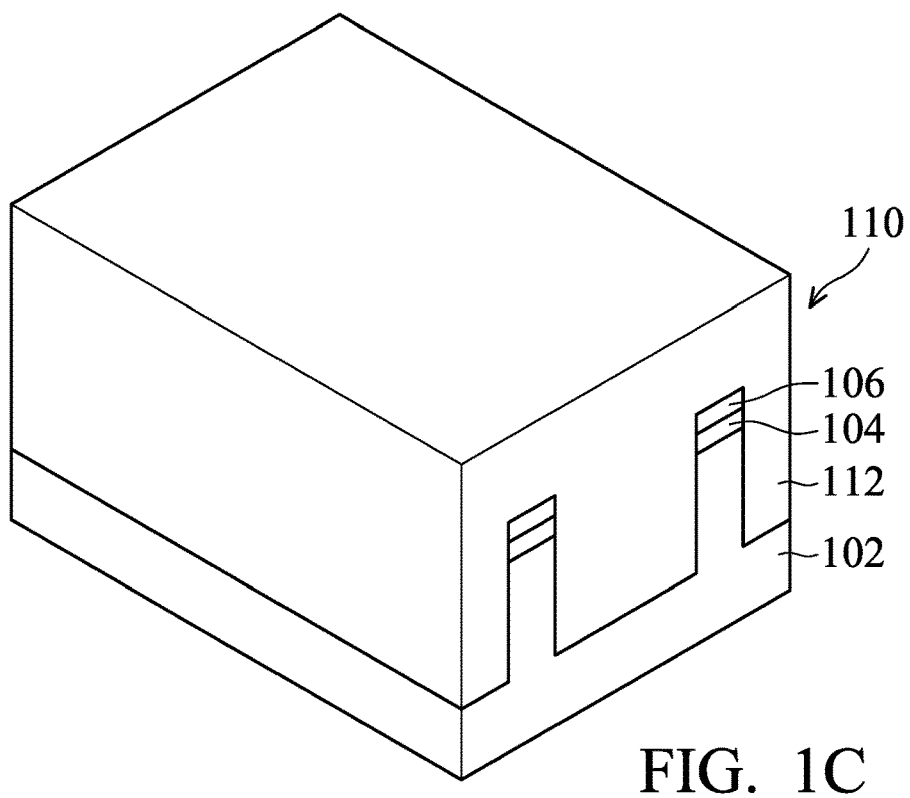

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process.

Afterwards, the patterned dielectric layer 104 and the patterned mask layer 106 are removed.

Figure 1D:
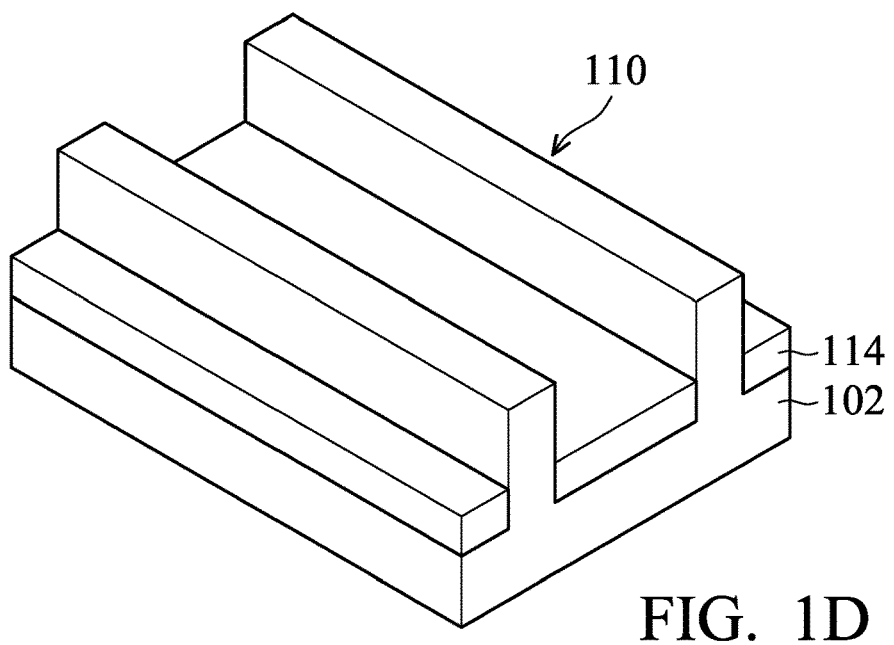

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

Figure 1E:
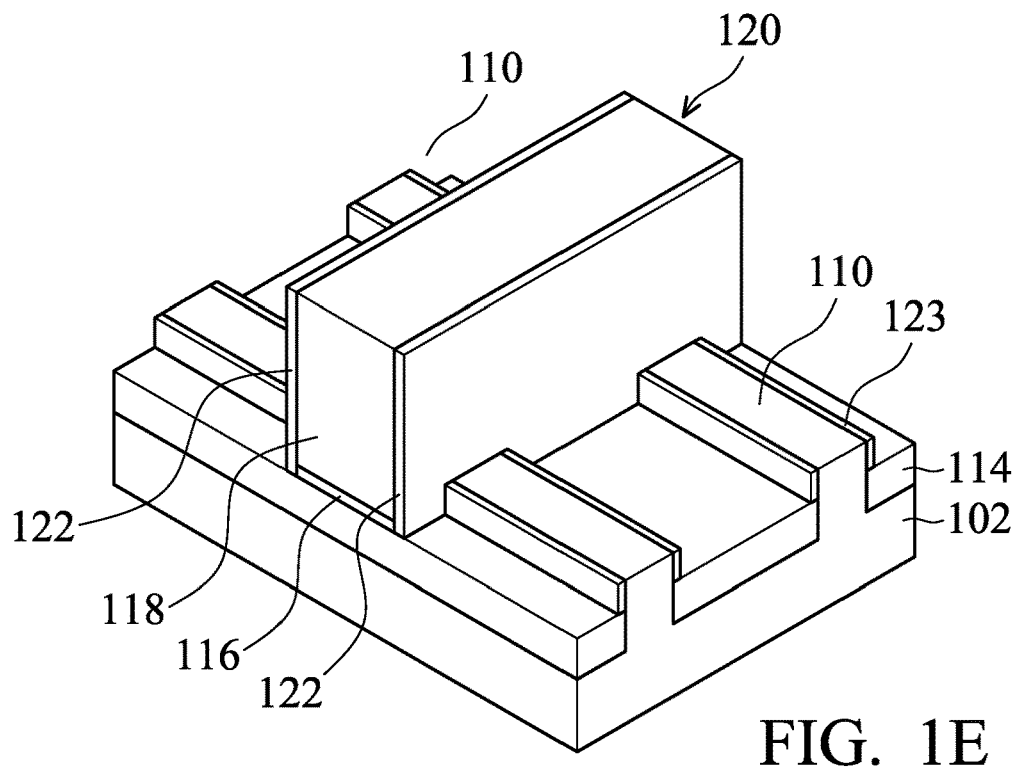

Afterwards, as shown in FIG. 1E, a dummy gate structure 120 is formed across the fin structure 110 and extends over the isolation structure 114, in accordance with some embodiments.

In some embodiments, the dummy gate structure 120 includes a dummy gate dielectric layer 116, and a dummy gate electrode layer 118 over the first dummy gate dielectric layer 116. After the dummy gate structure 120 is formed, the gate spacer layers 122 are formed on opposite sidewall surfaces of the dummy gate structure 120. The gate spacer layers 122 may be a single layer or multiple layers. The fin sidewall spacers 123 are formed on opposite sidewall surfaces of the fin structure 110. The fin sidewall spacers 123 may be a single layer or multiple layers.

Figure 1F:
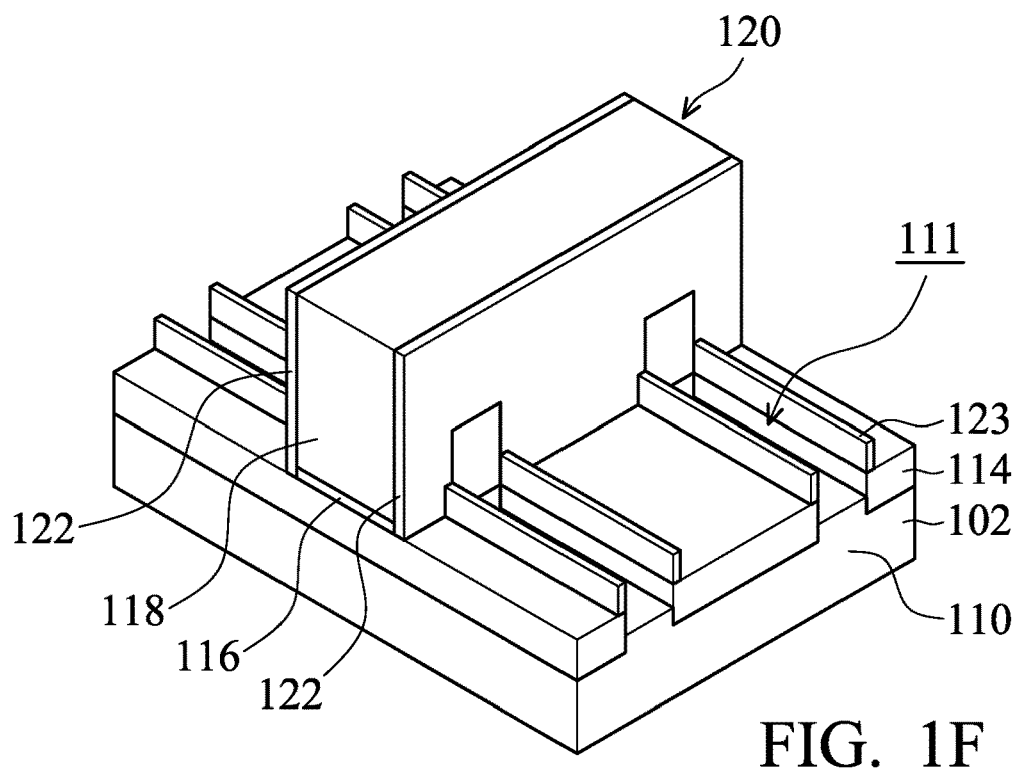

Next, as shown in FIG. 1F, a recess 111 is formed by removing a top portion of the fin structure 110, in accordance with some embodiments. The bottom surface of the recess 111 is lower than a top surface of the isolation structure 114.

Figure 1G:
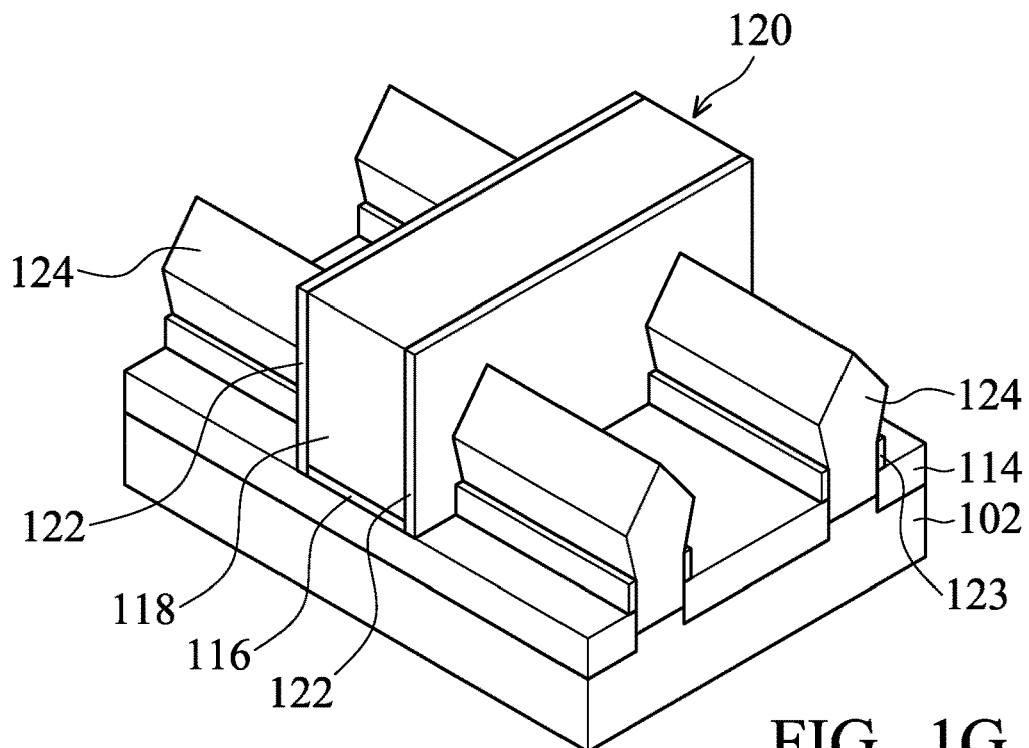

Afterwards, as shown in FIG. 1G, a source/drain (S/D) structure 124 is formed over the fin structure 110, in accordance with some embodiments.

In some embodiments, portions of the fin structure 110 adjacent to the dummy gate structure 120 are recessed to form recesses at two sides of the fin structure 110, and a strained material is grown in the recesses by an epitaxial (epi) process to form the S/D structure 124. The S/D structure 124 is formed over the fin structure 110.

In addition, the lattice constant of the strained material may be different from the lattice constant of the substrate 102. In some embodiments, the S/D structure 124 includes Ge, SiGe, InAs, InGaAs, InSb, GaAs, GaSb, InAlP, InP, or the like. In some embodiments, the S/D structure 124 is made of silicon germanium ($Si_xGe_y$, x is 0.05-0.5, y is 0.5-0.95), and the germanium atomic percentage is in a range from about 50 to about 95. In some other embodiments, the S/D structure 124 is made of doped silicon germanium ($Si_xGe_y$, x is 0.05-0.5, y is 0.5-0.95), such as boron-doped silicon germanium ($Si_xGe_y$, x is 0.05-0.5, y is 0.5-0.95).

Figure 1H:
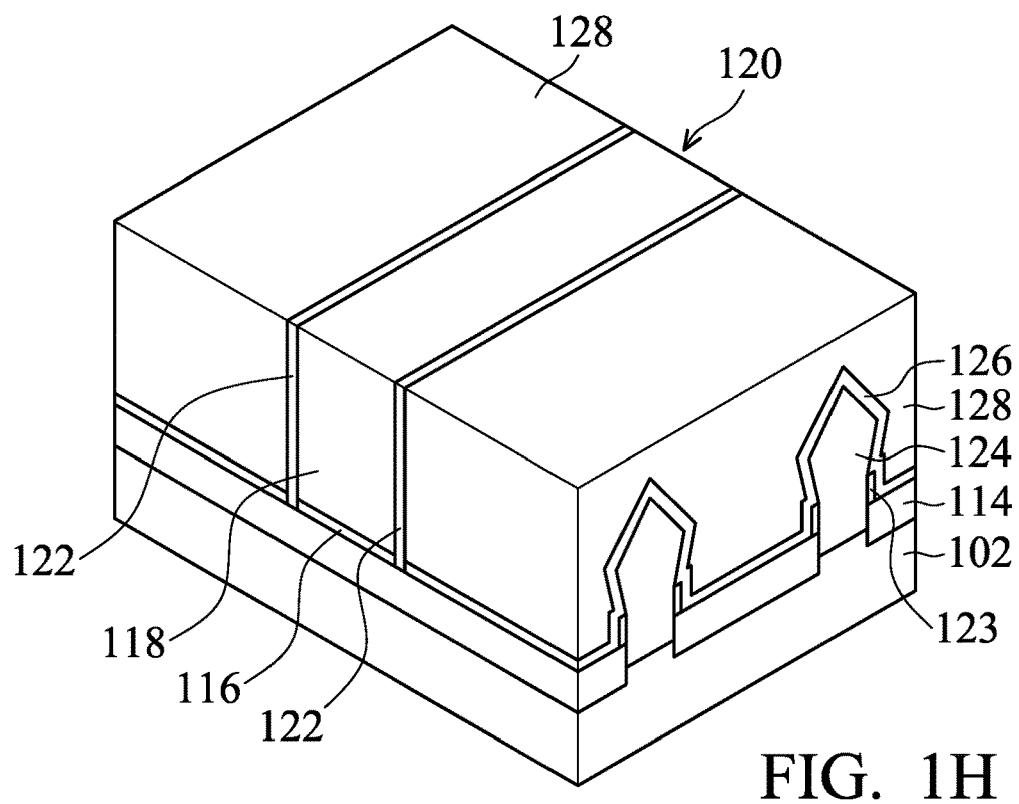

Afterwards, as shown in FIG. 1H, after the source/drain (S/D) structure 124 is formed, a contact etch stop layer (CESL) 126 is formed over the substrate 102, and an inter-layer dielectric (ILD) layer 128 is formed over the CESL 126.

In some other embodiments, the CESL 126 is made of silicon nitride, silicon oxynitride, and/or other applicable materials. The CESL 126 may be formed by plasma enhanced CVD, low-pressure CVD, ALD, or other applicable processes.

The ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 128 may be formed by chemical vapor deposition (CVD), physical vapor deposition, (PVD), atomic layer deposition (ALD), spin-on coating, or another applicable process.

Afterwards, a polishing process is performed on the ILD layer 128 until the top surface of the dummy gate structure 120 is exposed. In some embodiments, the ILD layer 128 is planarized by a chemical mechanical polishing (CMP) process.

Figure 1I:
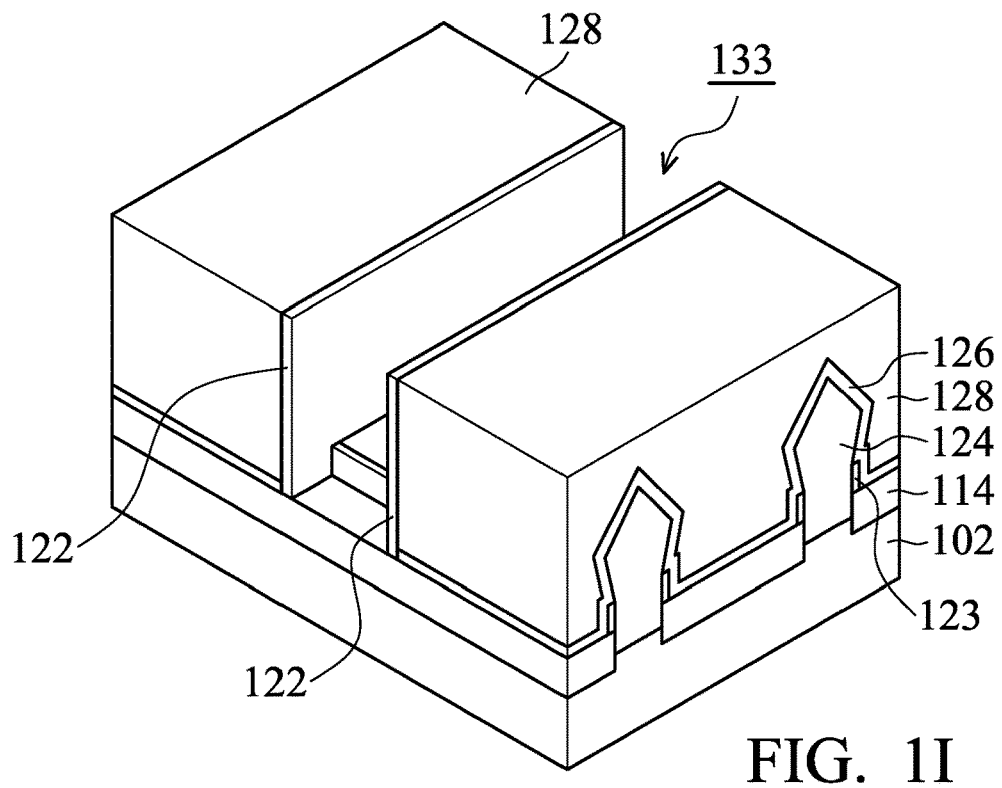

Afterwards, as shown in FIG. 1I, the dummy gate structure 120 is removed to form the trench 133 in the ILD layer 128, in accordance with some embodiments. The dummy gate dielectric layer 116 and the dummy gate electrode layer 118 are removed by an etching process, such as a dry etching process or a wet etching process.

Figure 1J:
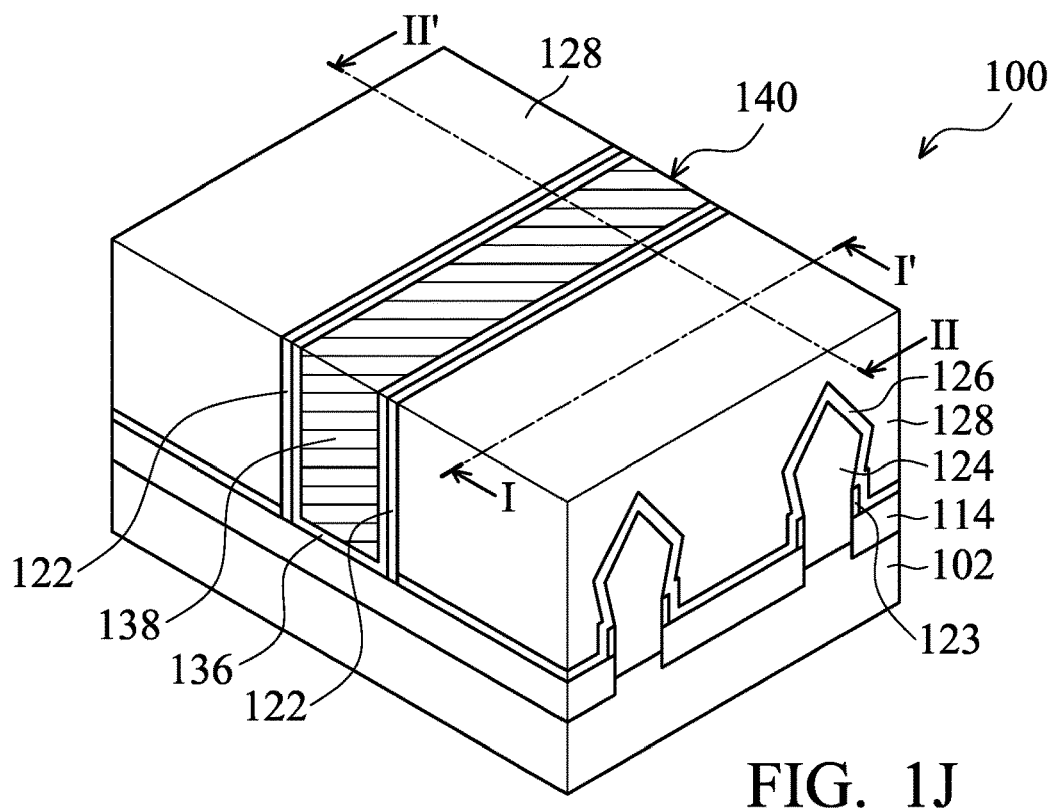

Next, as shown in FIG. 1J, a gate structure 140 is formed in the trench 133, in accordance with some embodiments. The gate structure 140 is formed on the isolation structure 114. The gate structure 140 includes a gate dielectric layer 134, and a gate electrode layer 138 over the gate dielectric layer 134.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials. The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some other embodiments, work function layer is formed between the gate dielectric layer 134 and the gate electrode layer 138. The work function layer may be made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru), or a combination thereof.

FIGS. 2A-2E show cross-sectional representations of various stages of forming the FinFET device structure 100 after the structure of FIG. 1J, in accordance with some embodiments of the disclosure.

Figure 2A:
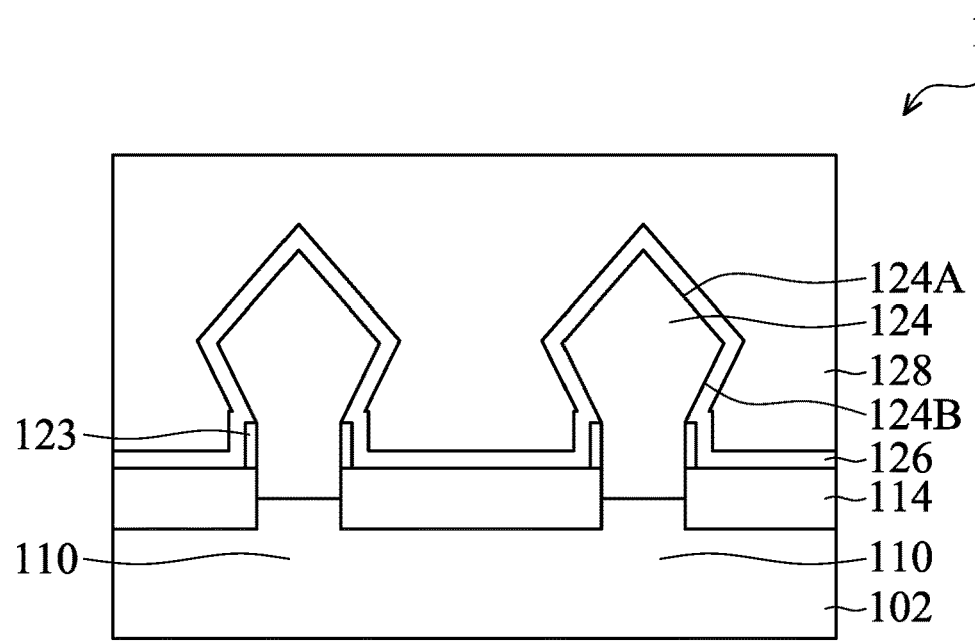
FIGS. 2A-2E show cross-sectional representations of various stages of forming the FinFET device structure after the structure of FIG. 1J, in accordance with some embodiments of the disclosure.

FIG. 2A shows a cross-sectional representation taken along the line I-I' of the FinFET device structure 100 in FIG. 1J. The CESL 126 is formed over the S/D structure 124, and the ILD layer 128 is formed over the CESL 126. The S/D structure 124 includes upwardly facing facets 124A and downwardly facing facets 124B.

Figure 2B:
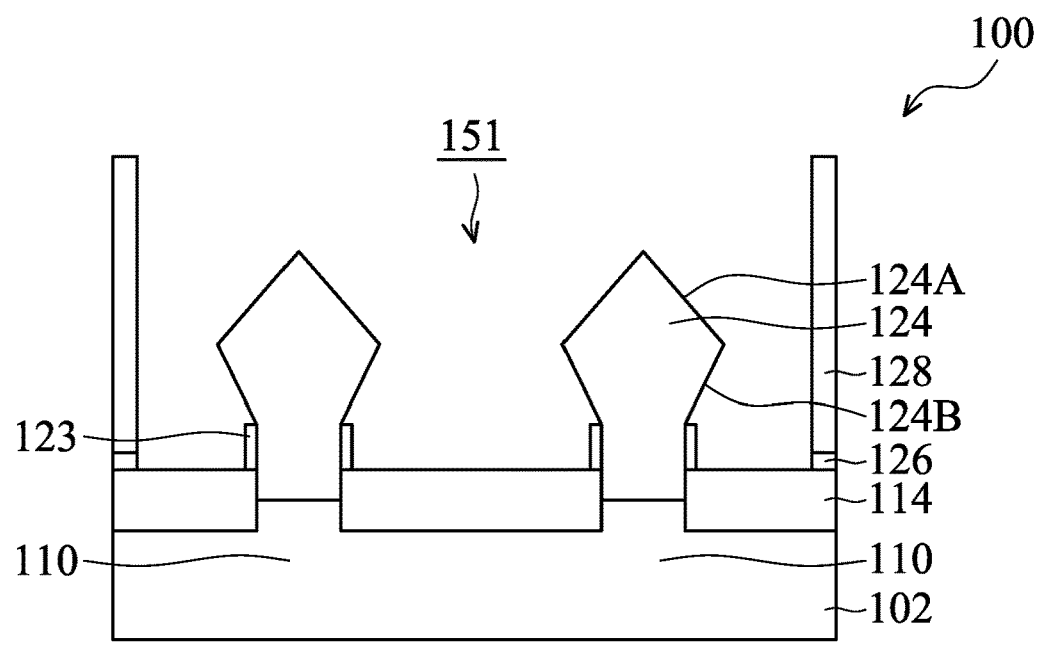

Afterwards, as shown in FIG. 2B, a portion of the ILD layer 128, and a portion of the CESL 126 are removed to form a contact opening 151, in accordance with some embodiments of the disclosure. As a result, a portion of the S/D structure 124 is exposed. More specifically, the outer portion of the S/D structure 124 is exposed. In some embodiments, the upwardly facing facets 124A and downwardly facing facets 124B of the S/D structure 124 are exposed.

Figure 2C:
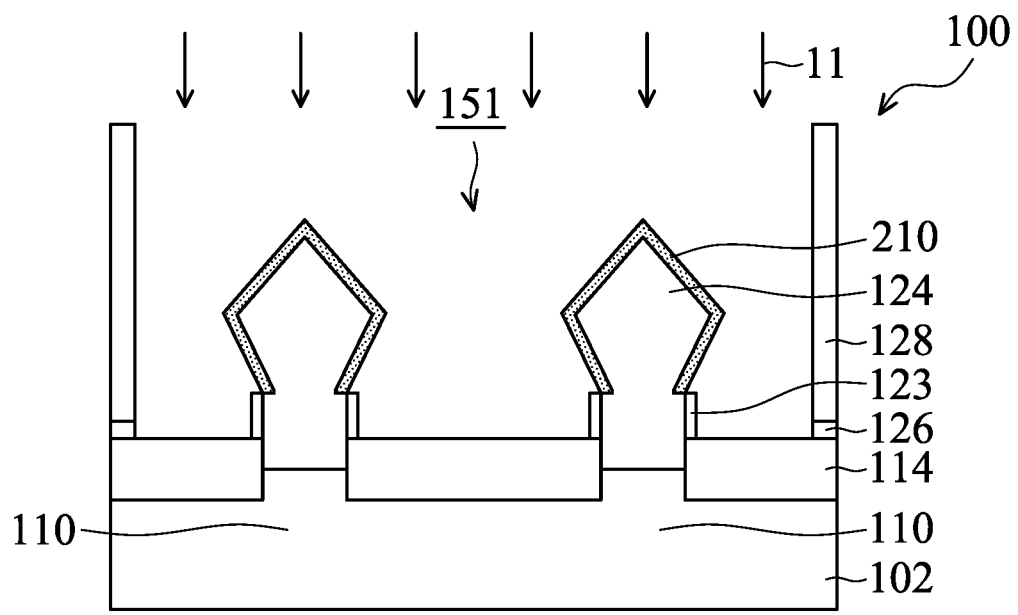

Next, as shown in FIG. 2C, a portion of the S/D structure 124 is doped to form a doped region 210 in the S/D structure 124, in accordance with some embodiments of the disclosure. The doped region 210 is formed by performing an ion implant process 11. More specifically, the S/D structure 124 includes an outer portion and an inner portion, and the outer portion of the S/D structure 124 is doped. The exposed surfaces of the upwardly facing facets 124A and the downwardly facing facets 124B of the S/D structure 124 are doped with a dopant to form the doped region 210.

Since the diamond shape of the S/D structure 124, the doped region 210 may have different doping concentration. In some embodiments, the doped region 210 has a first portion on the upwardly facing facets 124A, and a second portion on the downwardly facing facets 124B. The doping concentration of the first portion of the doped region 210 is greater than doping concentration of the second portion of the doped region 210. In other words, the first portion of the doped region 210 is doped heavier than the second portion of the doped region 210.

In some embodiments, the outer portion of the S/D structure 124 is doped with a dopant, including gallium (Ga) to form the doped region 210. The doped region 210 is gallium (Ga)-doped region. The doped region 210 is used to reduce the contact resistance between the S/D structure 124 and the metal silicide layer 216 (formed later).

In some embodiments, when the S/D structure 124 is made of undoped or doped silicon germanium (SiGe) and the dopant is gallium (Ga), the solid solubility of gallium (Ga) increases as the concentration of germanium (Ge) in silicon germanium (SiGe) increases. Unlike gallium (Ga), the solid solubility of boron (B) decreases as the concentration of germanium (Ge) in silicon germanium (SiGe) increases. If the S/D structure 124 is doped boron (B) only, the doping amount of boron (B) is limited due to the lower solid solubility of boron (B). Therefore, compared with boron (B), a higher amount of gallium (Ga) is doped into the S/D structure 124 due to the advantage of the high solid solubility of gallium (Ga).

The doped region 210 of the disclosure is doped with gallium (Ga), which is heavier than boron, and therefore gallium diffuses more slowly than boron to prevent the short channel effect caused by dopant diffusing into the channel region. The channel region is directly below the gate structure and between source structure and drain structure.

In some embodiments, the S/D structure 124 is made of silicon germanium (SixGey), x is in a range from about 5% to about 50%, and y is in a range from about 50% to about 95%. The compressive stress in the channel region of P-type FinFET is improved by increasing the concentration of germanium (Ge). If the concentration of germanium (Ge) is lower than 50%, the performance of the PMOS may be degraded. When the concentration of germanium (Ge) is within above-mentioned range, the performance of the P-type FinFET is improved.

In some embodiments, the S/D structure 124 is doped with gallium (Ga), and therefore the doped region 210 is made of gallium (Ga)-doped silicon germanium (SiGeGa).

The concentration of gallium (Ga) is in a range from about 1E19 atom/cm$^3$ to about 4E20 atom/cm$^3$. In some embodiments, the doped depth of the doped region 210 is in a range from about 5 nm to about 15 nm. The energy of the ion implant process 11 is in a range from about 2 KeV to about 6 Kev.

In some other embodiments, the S/D structure 124 is doped with gallium (Ga) and boron (B), and therefore the doped region 210 is made of gallium (Ga) and boron (B)-doped silicon germanium (SiGeGaB). In some embodiments, the concentration of gallium (Ga) is in a range from about 1E19 atom/cm$^3$ to about 4E20 atom/cm$^3$, and the concentration of boron (B) is in range from about 1E19 atom/cm$^3$ to about 1E21 atom/cm$^3$.

When gallium (Ga) and boron (B) both are co-implanted into the S/D structure 124, the doping sequence is important. In some embodiments, a first ion implant process is performed on the S/D structure 124, and the first ion implant process includes using a first dopant, and the first dopant is gallium (Ga). Afterwards, a second ion implant process is performed after the first ion implant process, the second ion implant process includes using a second dopant, and the first dopant is gallium (Ga).

The gallium (Ga) is doped firstly, and boron (B) is doped later. Boron (B) is lighter than gallium (Ga) and easily diffuses into the channel region. If boron is doped before gallium (Ga) is doped, boron may easily diffuse into the channel region to cause unwanted channeling effect. Therefore, the doping sequence of the disclosure is used to reduce and prevent boron diffusing into the channel region. As a result, the risk of short channel effect and leakage current may be reduced.

It should be noted that, in addition to the S/D structure 124, the ILD layer 128 is also doped with gallium (Ga) and gallium (Ga)/boron (B). In some embodiments, the ILD layer 128 is also doped with gallium (Ga), and the ILD layer 128 includes gallium (Ga) dopant. The Ga doping concentration of the ILD layer 128 decreases gradually from the top surface to the bottom surface. In some other embodiments, the ILD layer 128 is also doped with gallium (Ga) and boron (B), and the ILD layer 128 includes gallium (Ga) and boron (B) dopants.

Figure 2D:
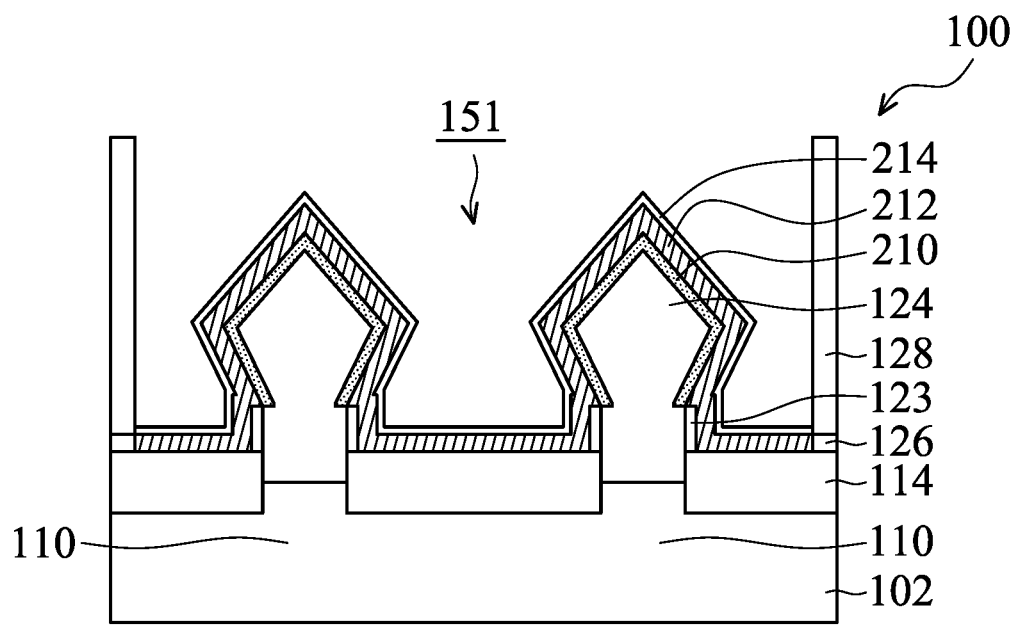

Subsequently, as shown in FIG. 2D, a metal layer 212 and a metal nitride layer 214 are formed on the doped region 210, in accordance with some embodiments of the disclosure. The metal layer 212 and a metal nitride layer 214 are formed on the isolation structure 114. The metal layer 212 is used to reduce the contact resistance for the S/D contact structure. The metal nitride layer 214 is used to as a diffusion barrier layer to prevent the metal in metal layer 212 from being oxidized.

The metal layer 212 may be made of nickel (Ni), titanium (Ti), cobalt (Co), tantalum (Ta) or platinum (Pt) or another applicable material. The metal nitride layer 214 may be made of nickel nitride (NiN), titanium nitride (TiN), cobalt nitride (CoN), tantalum nitride (TaN) or platinum nitride (PtN) or another applicable material. In some embodiments, the metal layer 212 is made of titanium (Ti), and the metal nitride layer 214 is made of titanium nitride. The metal layer 212 and the metal nitride layer 214 may be formed by a deposition process, such as chemical vapor deposition (CVD) process, physical vapor deposition (PVD) process, atomic layer deposition (ALD) process, or another applicable process. In some embodiments, the metal layer 212 is in a range from about 5 nm to about 7 nm. In some embodiments, the metal nitride layer 214 is in a range from about 1 nm to about 2 nm.

Figure 2E:
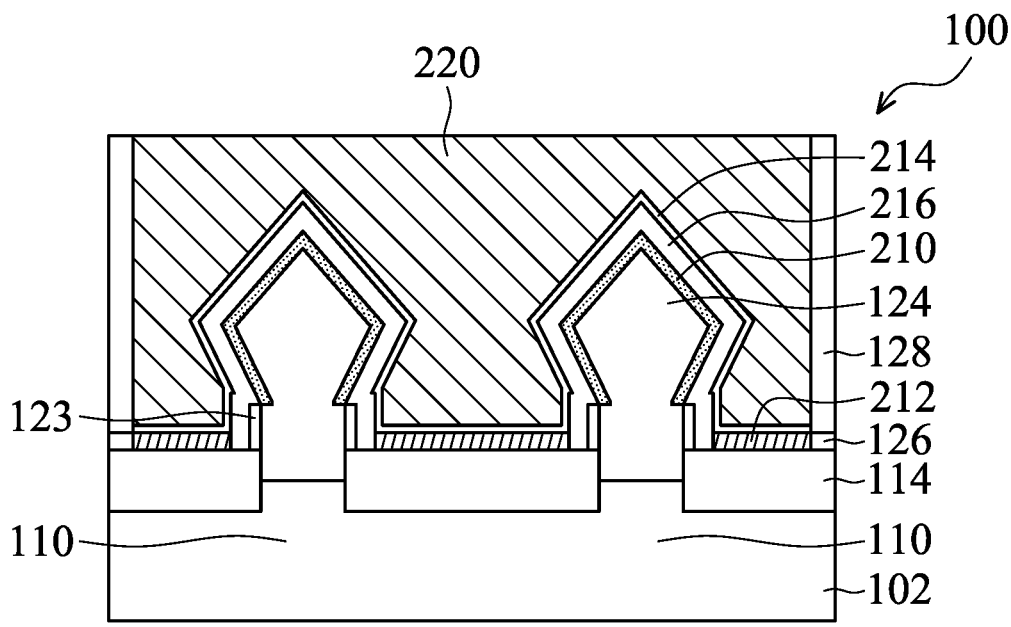
Figure 2E:
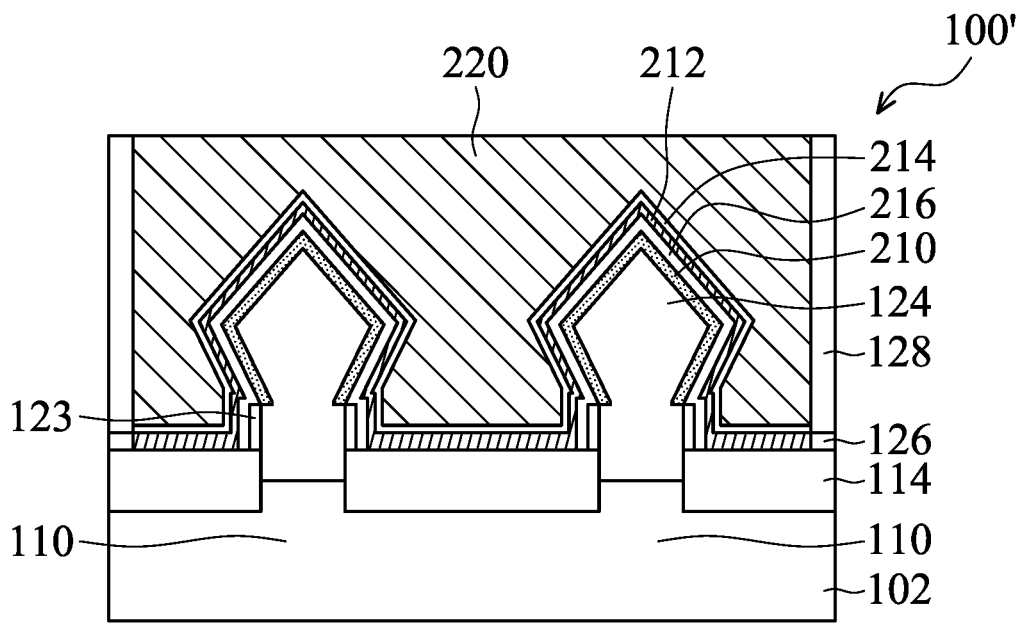

Next, as shown in FIG. 2E, an annealing process is performed on the metal layer 212 and the metal nitride layer 214 to form a metal silicide layer 216 over the doped region 210, and the remaining contact opening 151 is filled with a conductive material to form an S/D contact structure 220, in accordance with some embodiments of the disclosure. The metal silicide layer 216 is formed over the doped region 210 and in direct contact with the doped region 210. The annealing process is configured to active the dopant in the S/D structure 124.

The metal layer 212 reacts with the silicon in the S/D structure 124 to form the metal silicide layer 216 by the annealing process. In some embodiments, the metal layer 212 is made of titanium (Ti), and the metal silicide layer 216 is made of titanium silicide (TiSix). In some other embodiments, the metal layer 212 is made of tantalum (Ta), and the metal silicide layer 216 is made of or tantalum silicide (TaSix). The unreacted metal layer 212 and the metal nitride layer 214 are remaining on the isolation structure 114.

The annealing process may be a thermal soaking process, spike annealing process, a flash annealing process, or laser annealing process. In some embodiments, the annealing process is operated in a temperature in a range from about 500 degrees to about 700 degrees. In some embodiments, the annealing process is operated for a period of time in a range from about 5 s to about 30 s.

It should be noted that the when the doped region 210 is made of SiGeGaB (Ga and B-doped SiGe), and the metal silicide layer 216 is made of titanium silicide (TiSix), the titanium and the boron will react to form a compound. As a result, the boron in the doped region 210 may diffuse to the channel region.

The S/D contact structure 220 may be made of tungsten (W), tungsten alloy, aluminum (Al), aluminum alloy, copper (Cu) or copper alloy. The S/D contact structure 220 is electrically connected to the S/D structure 124 by the metal silicide layer 212.

It should be noted that the S/D structure 124 is made of semiconductor material, the metal silicide layer 216 is made of metal material, and therefore a barrier is between the semiconductor material and the metal material. If no interface layer between the metal silicide layer 212 and the S/D structure 124, there will exist at a junction between the metal silicide layer 212 and the S/D structure 124. The doped region 210 is configured to act as an interface layer to reduce contact resistance (Rcsd) between the metal silicide layer 212 and the S/D structure 124.

FIG. 2E' shows a cross-sectional representation of a FinFET device structure 100', in accordance with some embodiments of the disclosure. The structure of FIG. 2E' is similar to the structure shown in FIG. 2E, the difference is that the metal layer 212 is not fully reacted with the silicon of the S/D structure 124, and unreacted metal layer 212 is remaining on the metal silicide layer 216 as shown in FIG. 2E'. Furthermore, a portion of the metal layer 212 on the isolation structure 114 is thicker than the portion of the remaining metal layer 212 on the metal silicide layer 216.

Figure 3A:
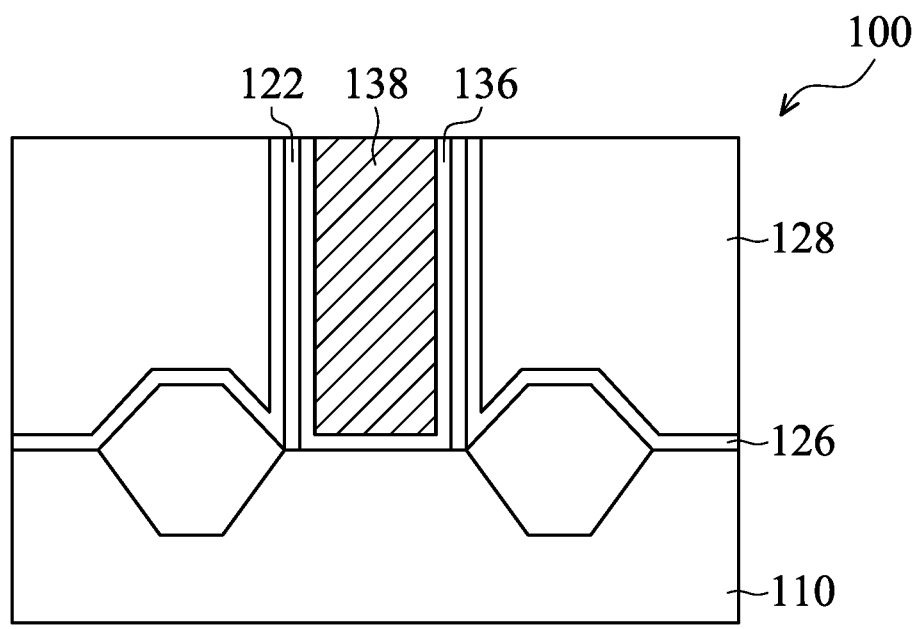
FIGS. 3A-3E show cross-sectional representations of the FinFET device structure after the structure of FIG. 1J, in accordance with some embodiments of the disclosure.

FIGS. 3A-3E show cross-sectional representations of the FinFET device structure 100 after the structure of FIG. 1J, in accordance with some embodiments of the disclosure. FIG. 3A is a cross-sectional representation taken along the line II-IF of the FinFET device structure 100 of FIG. 1J.

As shown in FIG. 3A, the gate spacer layers 122 are formed on opposite sidewall surfaces of the gate structure 140, in accordance with some embodiments of the disclosure. The CESL 126 is formed on the S/D structure 124, and the ILD layer 128 is formed on the CESL 126.

Figure 3B:
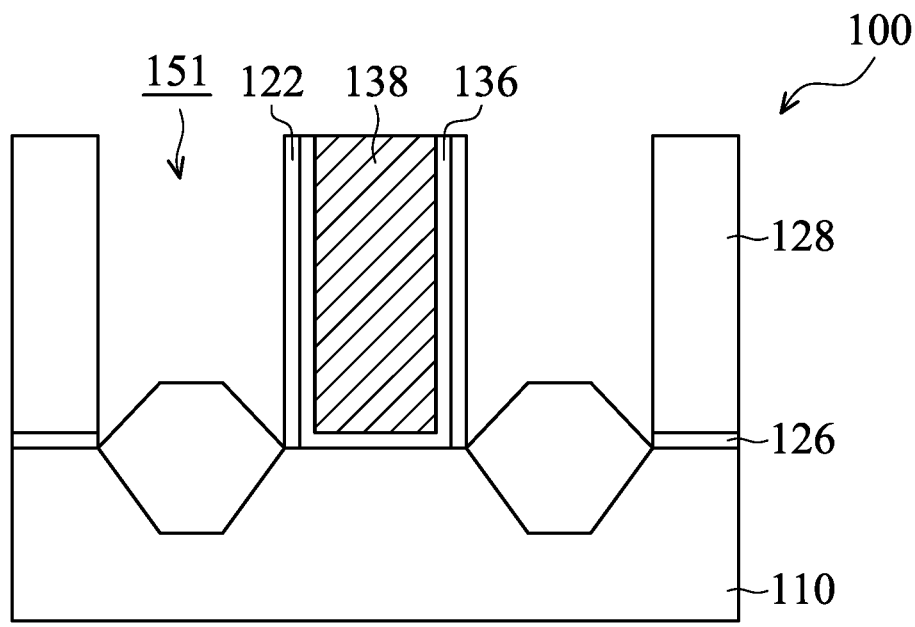

Next, as shown in FIG. 3B, a portion of the ILD layer 128, and a portion of the CESL 126 are removed to form the contact opening 151, in accordance with some embodiments of the disclosure. As a result, a top portion of the S/D structure 124 is exposed.

Figure 3C:
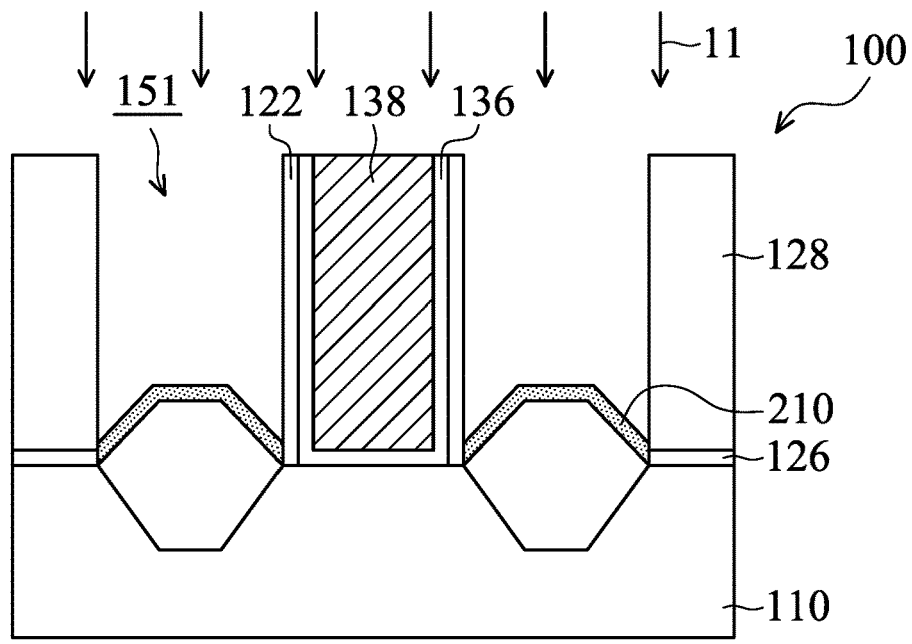

Subsequently, as shown in FIG. 3C, a portion of the S/D structure 124 is doped to form the doped region 210 in the S/D structure 124, in accordance with some embodiments of the disclosure. The portion of the S/D structure 124 is doped by performing the ion implant process 11. More specifically, the outer portion of the S/D structure 124 is doped to form the doped region 210.

Figure 3D:
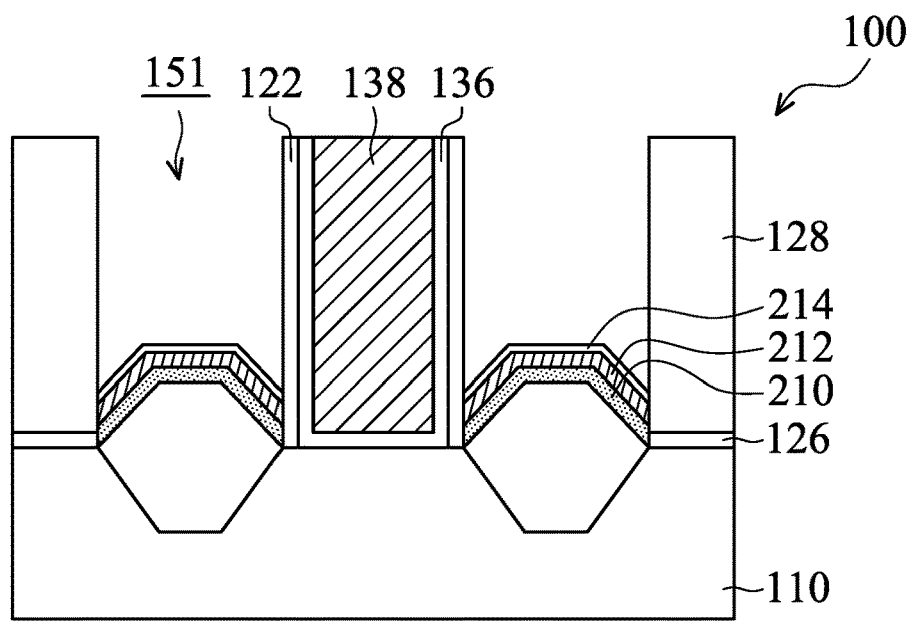

Afterwards, as shown in FIG. 3D, the metal layer 212 and the metal nitride layer 214 are formed on the doped region 210, in accordance with some embodiments of the disclosure.

Figure 3E:
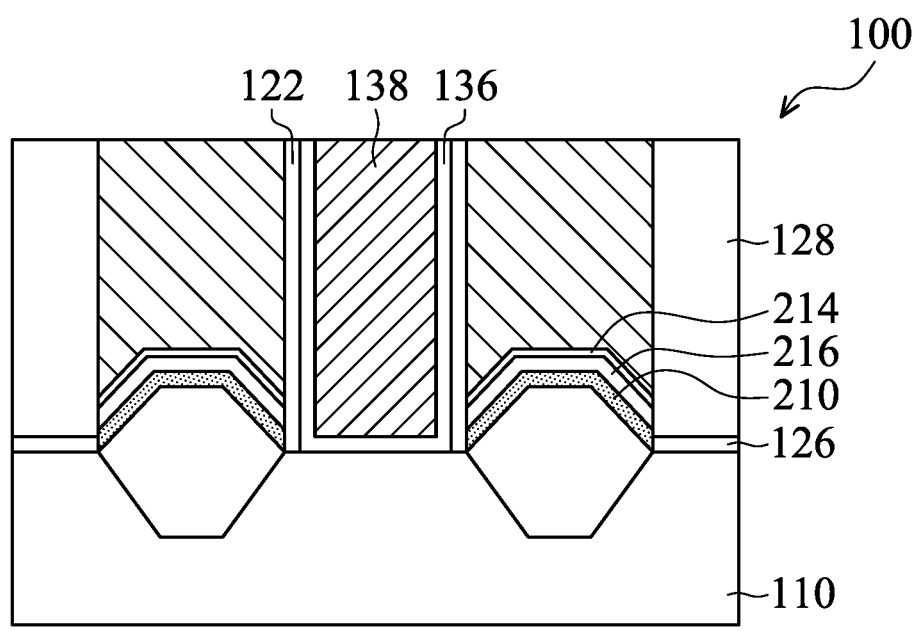
Figure 3E:
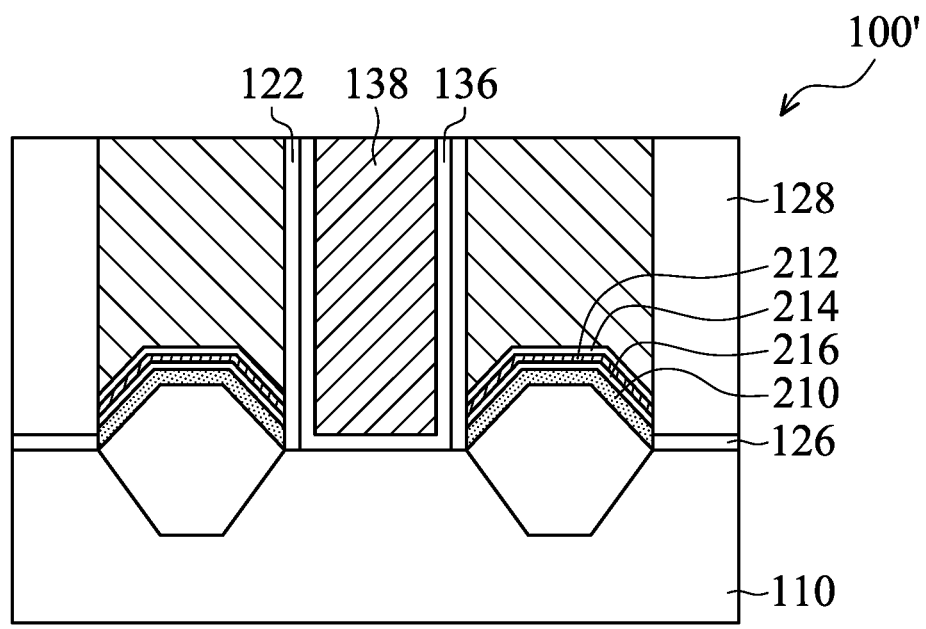

Next, as shown in FIG. 3E, an annealing process is performed on the metal layer 212 and the metal nitride layer 214 to form the metal silicide layer 216, and the S/D contact structure 220 is formed over the metal silicide layer 216, in accordance with some embodiments of the disclosure. The metal silicide layer 216 is formed over the doped region 210 and in direct contact with the doped region 210. The annealing process is configured to active the dopant in the S/D structure 124. In some embodiments, the silicon in the S/D structure 124 reacts with titanium (Ti) to form titanium silicide (TiSi) as the metal silicide layer 216.

FIG. 3E' shows a cross-sectional representation of the FinFET device structure 100', in accordance with some embodiments of the disclosure. The FinFET device structure 100' of FIG. 3E' is similar to the FinFET device structure 100 shown in FIG. 3E, the difference is that the metal layer 212 is not fully reacted with the silicon of the S/D structure 124, and unreacted metal layer 212 is remaining on the metal silicide layer 216 as shown in FIG. 3E'.

FIGS. 4A-4D show cross-sectional representations of a FinFET device structure 200, in accordance with some embodiments of the disclosure. Some processes and materials used to form the FinFET device structure 200 are similar to, or the same as, those used to form the FinFET device structure 100 and are not repeated herein.

Figure 4A:
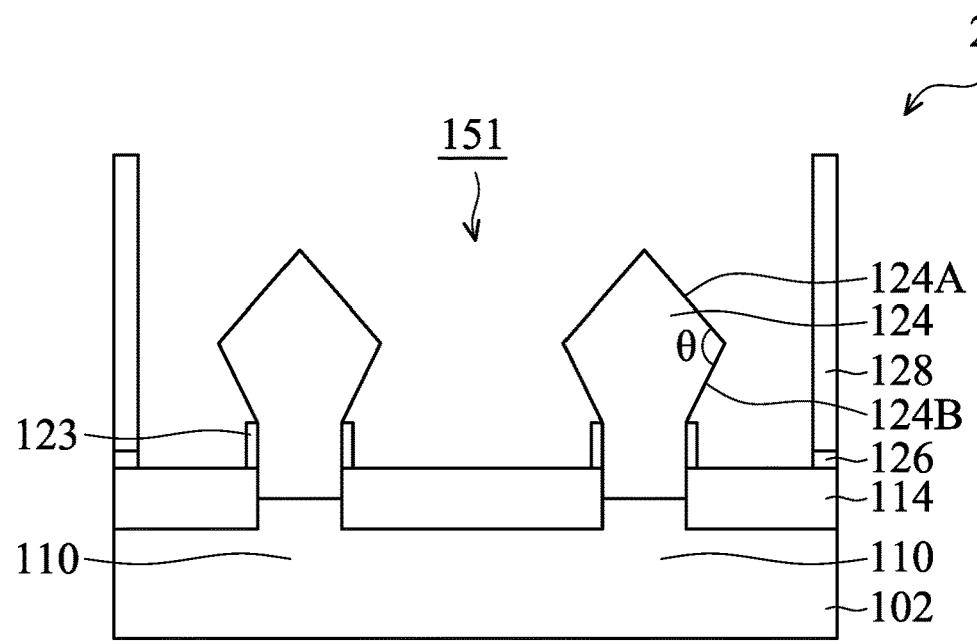
FIGS. 4A-4D show cross-sectional representations of a FinFET device structure, in accordance with some embodiments of the disclosure.

As shown in FIG. 4A, a portion of the ILD layer 128, and a portion of the CESL 126 are removed to form the contact opening 151, in accordance with some embodiments of the disclosure. More specifically, the upwardly facing facets 124A and downwardly facing facets 124B of the S/D structure 124 are exposed. There is an angle Θ between the upwardly facing facets 124A and downwardly facing facets 124B. In some embodiments, the angle Θ is between 80 degrees to about 150 degrees.

Figure 4B:
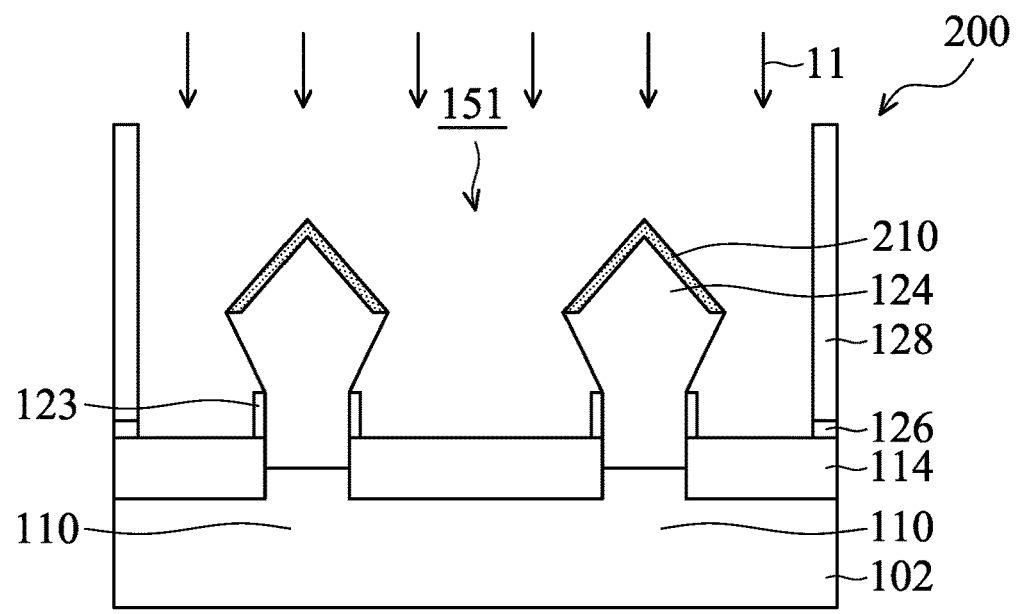

Next, as shown in FIG. 4B, a portion of the S/D structure 124 is doped to form the doped region 210 in the S/D structure 124, in accordance with some embodiments of the disclosure. The doped region 210 is formed by performing an ion implant process 11. In some embodiments, a portion of the S/D structure 124 is not doped by the ion implant process 11 due to the shadow effect. As a result, the doped region 210 is formed on the upwardly facing facets 124A, but not formed on the downwardly facing facets 124B.

Figure 4C:
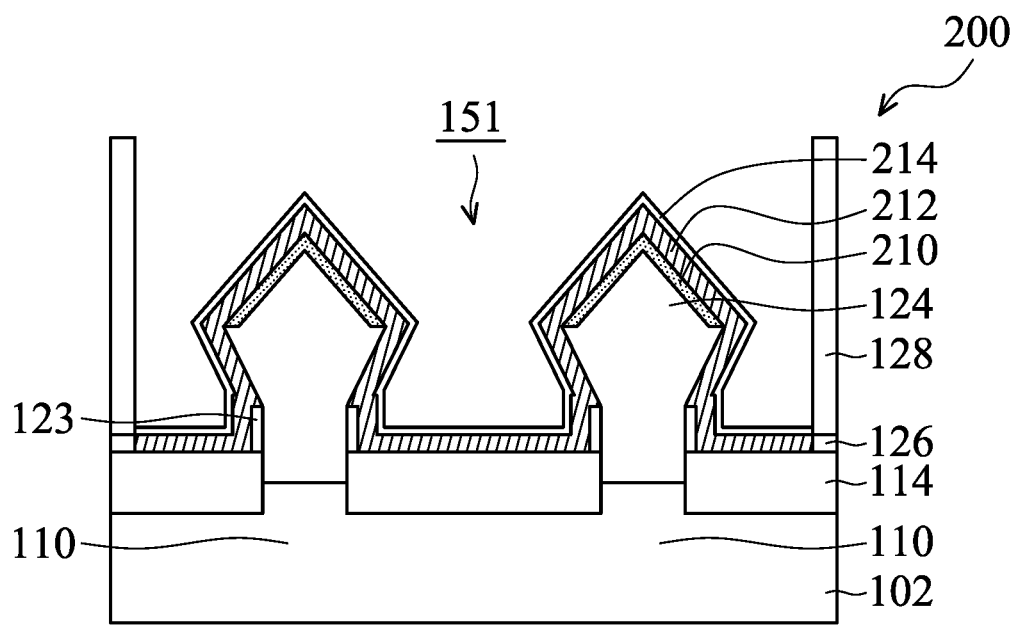

Afterwards, as shown in FIG. 4C, the metal layer 212 and the metal nitride layer 214 are formed on the doped region 210, in accordance with some embodiments of the disclosure.

Figure 4D:
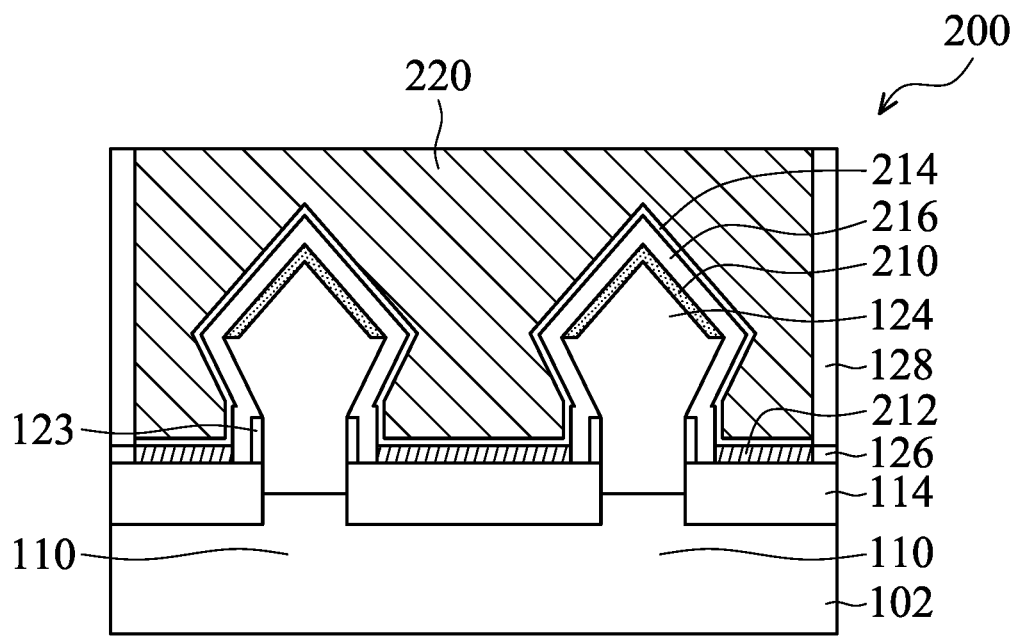
Figure 4D:
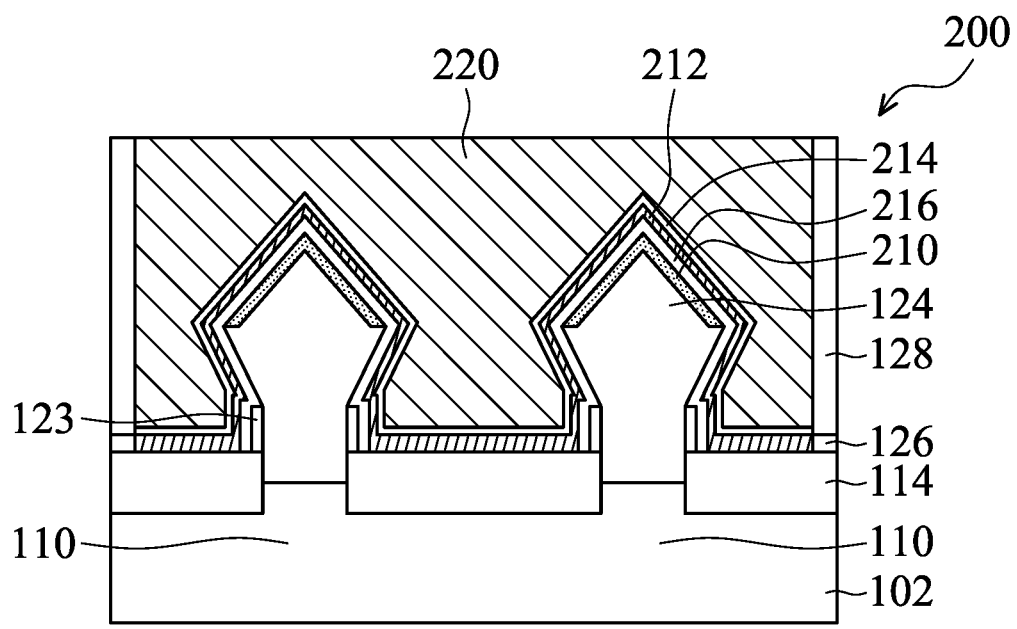

Next, as shown in FIG. 4D, an annealing process is performed on the metal layer 212 and the metal nitride layer 214 to form the metal silicide layer 216, and the S/D contact structure 220 is formed over the metal silicide layer 216, in accordance with some embodiments of the disclosure. It should be noted that the doped region 210 is between the S/D structure 124 and the metal silicide layer 216 to reduce the contact resistance between the S/D structure 124 and the metal silicide layer 216.

FIG. 4D' shows a cross-sectional representation of a FinFET device structure 200', in accordance with some embodiments of the disclosure. The FinFET device structure 200' of FIG. 4D' is similar to the FinFET device structure 200 shown in FIG. 4D, the difference is that the metal layer 212 is not fully reacted with the silicon of the S/D structure 124, and unreacted metal layer 212 is remaining on the metal silicide layer 216 as shown in FIG. 4D'. Therefore, the metal silicide layer 216 is between the doped region 210 and the metal layer 212, and the metal layer 212 is between the metal silicide layer 216 and the S/D contact structure 220. Furthermore, a portion of the metal layer 212 on the isolation structure 114 is thicker than the portion of the remaining metal layer 212 on the metal silicide layer 216.

FIGS. 5A-5D show cross-sectional representations of a FinFET device structure 300, in accordance with some embodiments of the disclosure.

Figure 5A:
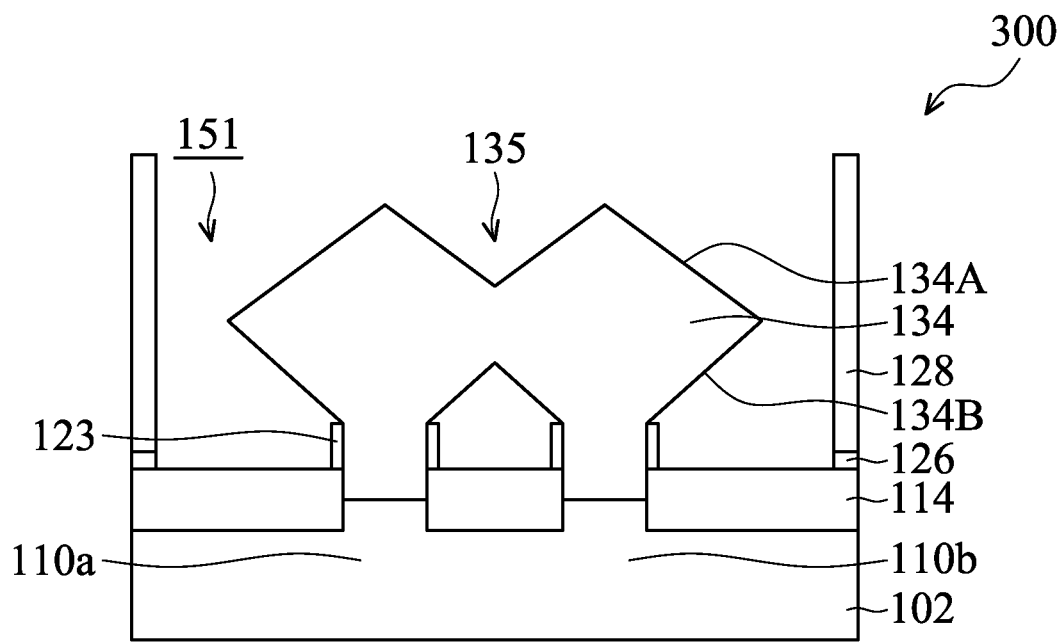
FIGS. 5A-5D show cross-sectional representations of a FinFET device structure, in accordance with some embodiments of the disclosure.

As shown in FIG. 5A, a merged S/D structure 134 is formed over the first fin structure 110a and the second fin structure 110b, in accordance with some embodiments of the disclosure. The merged S/D structure 134 has a recessed portion 135 at a center of the merged S/D structure 134. The merged S/D structure 134 provides a large surface area for landing the S/D contact structure 220 due to the recessed portion 135.

Figure 5B:
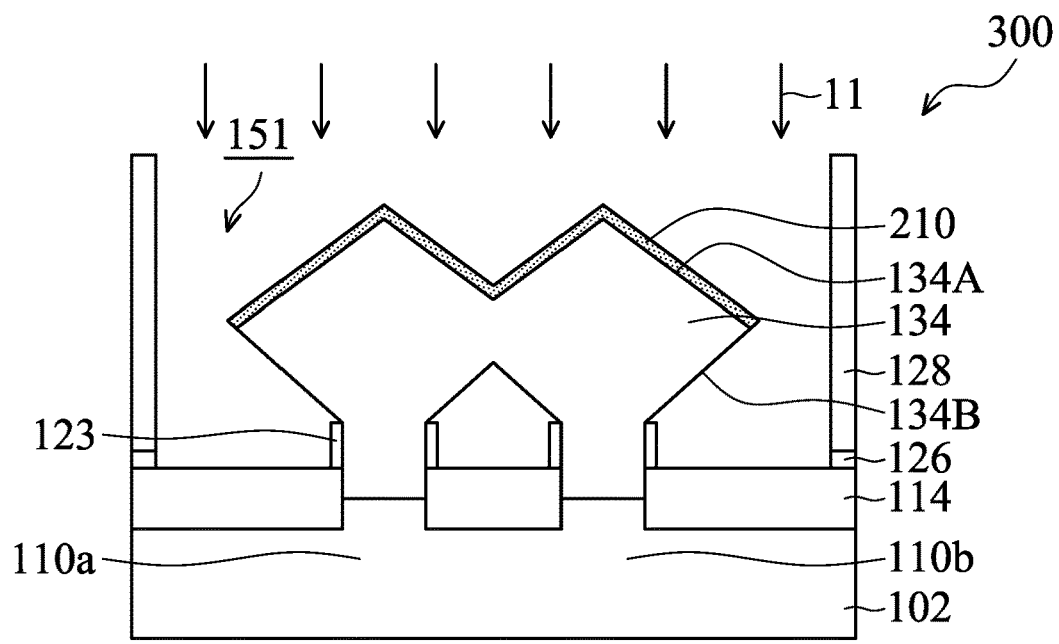

Next, as shown in FIG. 5B, a top portion of the merged S/D structure 134 is doped with a dopant to form the doped region 210, in accordance with some embodiments of the disclosure. The doped region 210 extends from a first position to a second position. The first position is formed above the first fin structure 110a, and the second portion is formed above the second fin structure 110b. The doped region 210 is formed on the upwardly facing facets 134A, but not formed on the downwardly facing facets 134B.

Figure 5C:
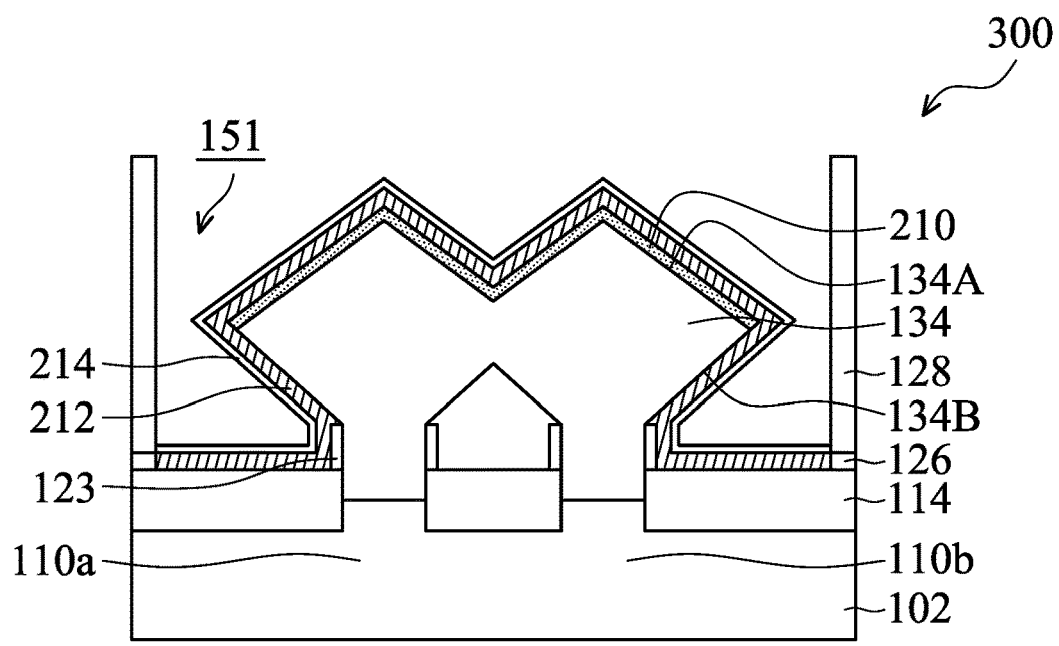

Afterwards, as shown in FIG. 5C, the metal layer 212 and the metal nitride layer 214 are formed on the doped region 210, in accordance with some embodiments of the disclosure.

Figure 5D:
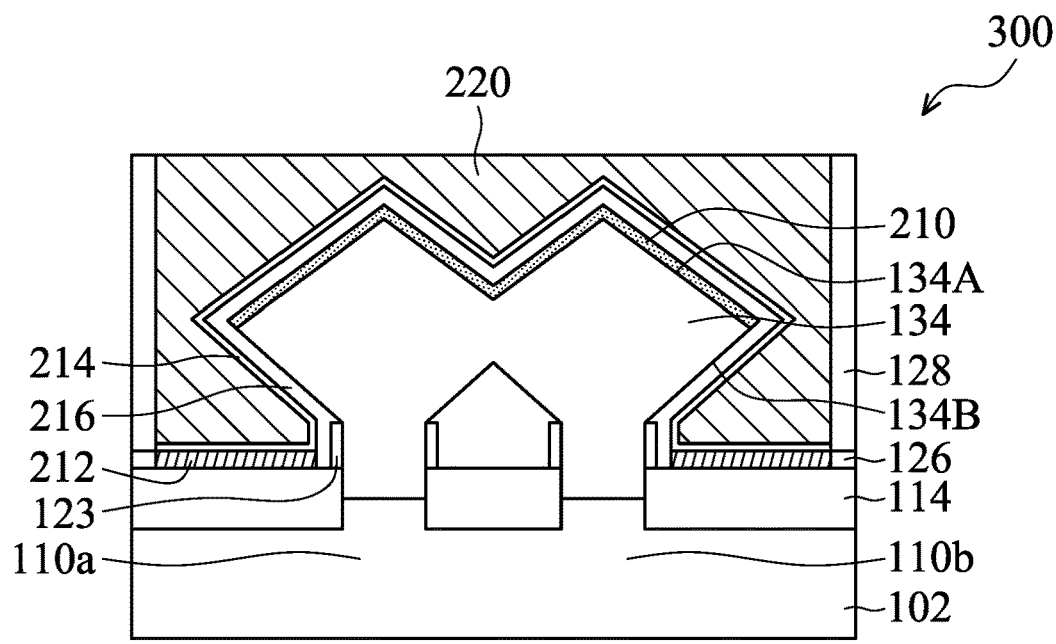
Figure 5D:
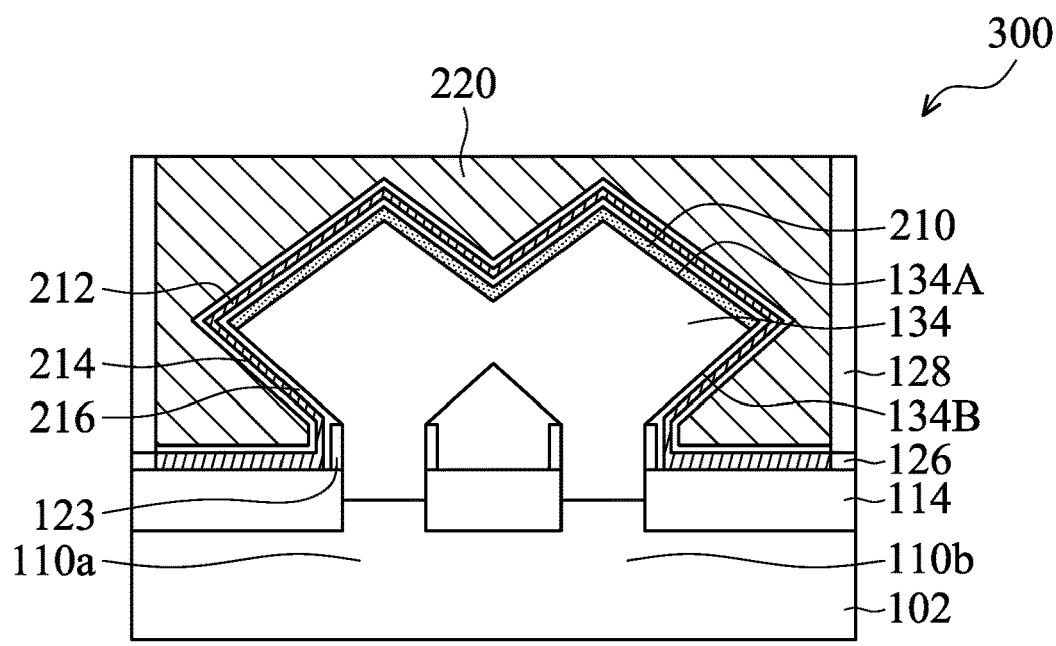

Subsequently, as shown in FIG. 5D, the metal silicide layer 216 is formed over the doped region 210 by performing an annealing process on the metal layer 212 and the metal nitride layer 214, and the remaining contact opening 151 is filled with a conductive material to form the S/D contact structure 220, in accordance with some embodiments of the disclosure.

The doped region 210 is between the merged S/D structure 134 and the metal silicide layer 216 to reduce the contact resistance between the merged S/D structure 134 and the metal silicide 216. The doped region 210 is formed along the shape of the merged S/D structure 134, and therefore the doped region 210 has a wave-shaped structure.

FIG. 5D' shows a cross-sectional representation of a FinFET device structure 300', in accordance with some embodiments of the disclosure. The FinFET device structure 300' of FIG. 5D' is similar to the FinFET device structure 300 shown in FIG. 5D, the difference is that the metal layer 212 is not fully reacted with the silicon of the S/D structure 124, and unreacted metal layer 212 is remaining on the metal silicide layer 216 as shown in FIG. 5D'. Therefore, the metal silicide layer 216 is between the doped region 210 and the metal layer 212, and the metal layer 212 is between the metal silicide layer 216 and the S/D contact structure 220.

It should be noted that the doped region 210 includes gallium (Ga). In some embodiments, the outer portion of the S/D structure 124 is doped with gallium (Ga) to form the gallium (Ga)-doped layer 210. The usage of gallium (Ga) of the gallium (Ga)-doped layer 210 provides several advantages. The solid solubility of gallium (Ga) increases as the concentration of germanium (Ge) in silicon germanium (SiGe) of the S/D structure 124 increases. Therefore, when the doped region 210 includes gallium (Ga), the performance of the FinFET device structure is improved because the doped region 210 with a greater germanium (Ge) concentration provides high stress for the FinFET device structure. Gallium (Ga) is heavier than boron, and therefore gallium diffuses more slowly than boron to prevent the short channel effect caused by dopant diffusing into the channel region. The channel region is directly below the gate structure and between source structure and drain structure. The solid solubility of gallium (Ga) is greater than that of boron and gallium is heavier than boron. Therefore, when the doped region 210 in the S/D structure 124 or the merged S/D structure 134 includes gallium (Ga), the performance of the FinFET device structure is improved.

In some embodiments, when the doped region is doped with gallium (Ga) and boron (B), gallium (Ga) is doped firstly, and boron (B) is doped later. Boron (B) is lighter than gallium (Ga) and easily diffuses into the channel region. If boron is doped before gallium (Ga) is doped, boron may diffuse into easily the channel region to cause unwanted channeling effect. Therefore, the doping sequence of the disclosure is used to reduce and prevent boron diffusing into the channel region. As a result, the risk of short channel effect and leakage current may be reduced.

Embodiments for forming a FinFET device structure and method for formation the same are provided. The FinFET device structure includes a fin structure formed over a substrate, and a gate structure formed over the fin structure. An S/D structure formed adjacent to the gate structure. An outer portion of the S/D structure is doped with a dopant to form a doped region. The doped region includes gallium (Ga), or gallium (Ga)/boron (B). A metal silicide layer is formed over the doped region and in direct contact with the doped region. The doped region is configured to reduce the contact resistance between the S/D structure made of semiconductor material and the metal silicide layer made of metal layer. Therefore, the performance of the FinFET device structure is improved.

In some embodiments, a method for forming a FinFET device structure is provided. The method includes forming a fin structure extended above a substrate and forming a gate structure formed over a portion of the fin structure. The method also includes forming a source/drain (S/D) structure over the fin structure, and the S/D structure is adjacent to the gate structure. The method further includes doping an outer portion of the S/D structure to form a doped region, and the doped region includes gallium (Ga). The method includes forming a metal silicide layer over the doped region; and forming an S/D contact structure over the metal silicide layer. In some embodiments, the method further includes: forming a metal layer over the doped region; forming a metal nitride layer over the metal layer; and performing an annealing process on the metal nitride layer and the metal layer to form the metal silicide layer over the doped region. In some embodiments, forming the source/drain (S/D) structure over the fin structure includes: removing a portion of the fin structure to form a recess adjacent to the gate structure; and epitaxially forming a strained material in the recess and over the fin structure to form the source/drain (S/D) structure. In some embodiments, the source/drain (S/D) structure is made of silicon germanium (SiGe), and the doped region is made of Ga-doped SiGe or Ga and B-doped SiGe. In some embodiments, forming the doped region over the S/D structure includes: performing a first ion implant process on the S/D region, wherein the first ion implant process includes using a first dopant, and the first dopant includes gallium (Ga). In some embodiments, the method further includes: performing a second ion implant process on the S/D region after performing the first ion implant process, wherein the second ion implant process includes using a second dopant, and the second dopant includes boron (B). In some embodiments, the S/D structure includes a first sidewall and a second sidewall over the substrate, and the metal silicide layer is in direct contact with the doped region of the S/D structure at the first sidewall and is in direct contact with an undoped region of the S/D structure at the second sidewall.

In some embodiments, a method for forming a FinFET device structure is provided. The method includes forming a fin structure extended above a substrate; forming a gate structure formed over the fin structure; forming a source/drain (S/D) structure over the fin structure, wherein the S/D structure is adjacent to the gate structure; and forming an inter-layer dielectric (ILD) layer surrounding the S/D structure, wherein the ILD layer is doped with gallium (Ga), wherein a gallium (Ga) doping concentration of the ILD layer increases gradually from bottom to top. In some embodiments, the method further includes: forming a metal silicide layer formed over the S/D structure; and forming an S/D contact structure over the metal silicide layer. In some embodiments, forming the metal silicide layer includes: forming a metal layer over the S/D structure; forming a metal nitride layer over the metal layer; and performing an annealing process on the metal nitride layer and the metal layer to form the metal silicide layer. In some embodiments, the annealing process is performed in a temperature in a range from about 500 degrees to about 700 degrees. In some embodiments, the annealing process is performed for a period of time in a range from about 5 s to about 30 s. In some embodiments, a thickness of the metal layer is greater than a thickness of the metal nitride layer. In some embodiments, the method further includes doping an outer portion of the S/D structure to form a doped region, wherein the doped region includes gallium (Ga). In some embodiments, the ILD layer and the outer portion of the S/D structure are doped using single ion implant process.

In some embodiments, a method for forming a FinFET device structure is provided. The method includes forming a fin structure extended above a substrate; forming a gate structure formed over the fin structure; forming a source/drain (S/D) structure over the fin structure, wherein the S/D structure is adjacent to the gate structure; performing a first ion implant process on the S/D structure using a first dopant, wherein the first dopant includes gallium (Ga); and performing a second ion implant process on the S/D structure using a second dopant after performing the first ion implant process, wherein the second dopant includes boron (B). In some embodiments, an energy of the first ion implant process or the second ion implant process is in a range from about 2 KeV to about 6 Kev. In some embodiments, the method further includes: forming an inter-layer dielectric (ILD) layer over the fin structure and adjacent to the gate structure; and doping the ILD layer with the first dopant using the first ion implant process, and a doping concentration of the first dopant in the ILD layer increases gradually from bottom to top. In some embodiments, the method further includes doping the ILD layer with the second dopant using the second ion implant process. In some embodiments, the method further includes forming a metal silicide layer formed over the doped S/D structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
    forming a fin structure extended above a substrate;
    forming a plurality of sidewall spacers on opposite sidewall surfaces of the fin structure;
    forming a gate structure formed over a portion of the fin structure;
    forming a source/drain (S/D) structure over the fin structure, wherein the S/D structure is adjacent to the gate structure and comprises a plurality of upwardly facing facets and a plurality of downwardly facing facets, wherein the S/D structure further comprises a plurality of sidewalls covered by the sidewall spacers, and the upwardly facing facets and the downwardly facing facets are located above the sidewalls of the S/D structure;
    doping an outer portion of the S/D structure to form a doped region, wherein the doped region comprises gallium (Ga) and is located on the upwardly facing facets and the downwardly facing facets;
    forming a metal silicide layer over the doped region, wherein the S/D structure comprises a first sidewall and a second sidewall over the substrate, and the metal silicide layer is in direct contact with the doped region of the S/D structure at the first sidewall and is in direct contact with an undoped region of the S/D structure at the second sidewall; and
    forming an S/D contact structure over the metal silicide layer.

2. The method for forming the fin field effect transistor (FinFET) device structure as claimed in claim 1, further comprising:
    forming a metal layer over the doped region;
    forming a metal nitride layer over the metal layer; and
    performing an annealing process on the metal nitride layer and the metal layer to form the metal silicide layer over the doped region.

3. The method for forming the fin field effect transistor (FinFET) device structure as claimed in claim 1, wherein forming the source/drain (S/D) structure over the fin structure comprises:
    removing a portion of the fin structure to form a recess adjacent to the gate structure; and
    epitaxially forming a strained material in the recess and over the fin structure to form the source/drain (S/D) structure.

4. The method for forming the fin field effect transistor (FinFET) device structure as claimed in claim 1, wherein the source/drain (S/D) structure is made of silicon germanium (SiGe), and the doped region is made of Ga-doped SiGe or Ga and B-doped SiGe.

5. The method for forming the fin field effect transistor (FinFET) device structure as claimed in claim 1, wherein forming the doped region over the S/D structure comprises:
    performing a first ion implant process on the S/D region, wherein the first ion implant process comprises using a first dopant, and the first dopant comprises gallium (Ga).

6. The method for forming the fin field effect transistor (FinFET) device structure as claimed in claim 5, further comprising:
    performing a second ion implant process on the S/D region after performing the first ion implant process, wherein the second ion implant process comprises using a second dopant, and the second dopant comprises boron (B).

7. The method for forming the fin field effect transistor (FinFET) device structure as claimed in claim 1, further comprising:
    forming an inter-layer dielectric (ILD) layer surrounding the S/D structure, wherein the ILD layer is doped with gallium (Ga), wherein a gallium (Ga) doping concentration of the ILD layer increases gradually from bottom to top.

8. A method for forming a fin field effect transistor (FinFET) device structure, comprising:
    forming a fin structure extended above a substrate;
    forming a gate structure formed over the fin structure;
    forming a source/drain (S/D) structure over the fin structure, wherein the S/D structure is adjacent to the gate structure; and
    forming an inter-layer dielectric (ILD) layer surrounding the S/D structure, wherein the ILD layer is doped with gallium (Ga), wherein a gallium (Ga) doping concentration of the ILD layer increases gradually from bottom to top.

9. The method for forming the fin field effect transistor (FinFET) device structure as claimed in claim 8, further comprising:
    forming a metal silicide layer formed over the S/D structure; and
    forming an S/D contact structure over the metal silicide layer.

10. The method for forming the fin field effect transistor (FinFET) device structure as claimed in claim 9, wherein forming the metal silicide layer comprises:
    forming a metal layer over the S/D structure;
    forming a metal nitride layer over the metal layer; and
    performing an annealing process on the metal nitride layer and the metal layer to form the metal silicide layer.

11. The method for forming the fin field effect transistor (FinFET) device structure as claimed in claim 10, wherein the annealing process is performed in a temperature in a range from about 500 degrees to about 700 degrees.

12. The method for forming the fin field effect transistor (FinFET) device structure as claimed in claim 10, wherein the annealing process is performed for a period of time in a range from about 5 s to about 30 s.

13. The method for forming the fin field effect transistor (FinFET) device structure as claimed in claim 10, wherein a thickness of the metal layer is greater than a thickness of the metal nitride layer.

14. The method for forming the fin field effect transistor (FinFET) device structure as claimed in claim 8, further comprising doping an outer portion of the S/D structure to form a doped region, wherein the doped region comprises gallium (Ga).

15. The method for forming the fin field effect transistor (FinFET) device structure as claimed in claim 14, wherein the ILD layer and the outer portion of the S/D structure are doped using single ion implant process.

16. A method for forming a fin field effect transistor (FinFET) device structure, comprising:
   forming a fin structure extended above a substrate;
   forming a gate structure formed over the fin structure;
   forming a source/drain (S/D) structure over the fin structure, wherein the S/D structure is adjacent to the gate structure;
   performing a first ion implant process on the S/D structure using a first dopant, wherein the first dopant comprises gallium (Ga); and
   performing a second ion implant process on the S/D structure using a second dopant after performing the first ion implant process, wherein the second dopant comprises boron (B).

17. The method for forming the fin field effect transistor (FinFET) device structure as claimed in claim 16, wherein an energy of the first ion implant process or the second ion implant process is in a range from about 2 KeV to about 6 Kev.

18. The method for forming the fin field effect transistor (FinFET) device structure as claimed in claim 16, further comprising:
   forming an inter-layer dielectric (ILD) layer over the fin structure and adjacent to the gate structure; and
   doping the ILD layer with the first dopant using the first ion implant process, and a doping concentration of the first dopant in the ILD layer increases gradually from bottom to top.

19. The method for forming the fin field effect transistor (FinFET) device structure as claimed in claim 18, further comprising doping the ILD layer with the second dopant using the second ion implant process.

20. The method for forming the fin field effect transistor (FinFET) device structure as claimed in claim 16, further comprising forming a metal silicide layer formed over the doped S/D structure.

* * * * *